US011579642B2

(12) United States Patent
Venugopal et al.

(10) Patent No.: US 11,579,642 B2
(45) Date of Patent: Feb. 14, 2023

(54) POWER DOWN DETECTION FOR NON-DESTRUCTIVE ISOLATION SIGNAL GENERATION

(71) Applicant: Apple Inc., Cupertino, CA (US)

(72) Inventors: Vivekanandan Venugopal, San Jose, CA (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/411,491

(22) Filed: Aug. 25, 2021

(65) Prior Publication Data

US 2022/0043469 A1    Feb. 10, 2022

Related U.S. Application Data

(63) Continuation of application No. 16/905,031, filed on Jun. 18, 2020, now Pat. No. 11,132,010.

(51) Int. Cl.
*G05F 1/46* (2006.01)
*G01R 21/133* (2006.01)
*G04F 10/00* (2006.01)

(52) U.S. Cl.
CPC ............. *G05F 1/46* (2013.01); *G01R 21/133* (2013.01); *G04F 10/005* (2013.01)

(58) Field of Classification Search
CPC .................. H03K 17/223; H03K 17/22; H03K 3/356008; G06F 1/24; G11C 5/143
USPC .................... 327/77, 142, 143, 198
See application file for complete search history.

(56) References Cited

U.S. PATENT DOCUMENTS

| | | | |
|---|---|---|---|
| 6,215,342 B1 * | 4/2001 | Morrill | G06F 1/24 327/143 |
| 7,292,672 B2 * | 11/2007 | Isono | H03K 5/135 377/64 |
| 8,669,794 B2 | 3/2014 | Park et al. | |
| 9,000,799 B1 * | 4/2015 | Rajagopal | H03K 19/007 327/143 |
| 2006/0139070 A1 * | 6/2006 | Kim | H03K 17/223 327/143 |
| 2008/0054980 A1 * | 3/2008 | Bajkowski | H03K 3/356121 327/333 |
| 2012/0105107 A1 | 5/2012 | Moon | |
| 2015/0256331 A1 | 9/2015 | Omata | |
| 2018/0115406 A1 | 4/2018 | Moore | |
| 2018/0267480 A1 | 9/2018 | Mahajan | |

(Continued)

FOREIGN PATENT DOCUMENTS

KR    100252474 B1    5/2000

*Primary Examiner* — Quan Tra
(74) *Attorney, Agent, or Firm* — Kowert, Hood, Munyon, Rankin & Goetzel, P.C.; Gareth M. Sampson

(57) ABSTRACT

A power detection circuit for detecting powering down of a voltage domain in an integrated circuit is disclosed. The power detection circuit is placed in or near the voltage domain in the integrated circuit to provide power detection on the integrated circuit. The power detection circuit detects powering down of the voltage domain to provide an isolation enable signal to another voltage domain that interfaces with the powering down voltage domain. The isolation enable signal may be used by an isolation cell coupled to the non-powering down voltage domain to prevent corrupted logic being received from the powering down voltage domain.

20 Claims, 9 Drawing Sheets

(56) References Cited

U.S. PATENT DOCUMENTS

2019/0072590 A1     3/2019   Kim et al.
2021/0144045 A1     5/2021   Gossmann

\* cited by examiner

POWER DOWN DETECTION FOR NON-DESTRUCTIVE ISOLATION SIGNAL GENERATION

This application is a divisional of U.S. patent application Ser. No. 16/905,031, filed, Jun. 18, 2020, now U.S. Pat. No. 11,132,010, the contents of which are hereby incorporated by reference in their entireties.

BACKGROUND

Technical Field

Embodiments described herein relate to electronic circuits. More particularly, embodiments described herein relate to electronic circuits for detecting powering down of a voltage domain in an integrated circuit.

Description of the Related Art

In current SoCs (systems on a chip), there are blocks (e.g., IP blocks, logic blocks, or circuit blocks) in multiple voltage domains. Different voltage domains in an SoC may interact with each other through interface signals. The interface signals go through interface paths at crossings between voltage domains (e.g., domain crossings). These domain crossings may include isolation cells and/or level shifters that the interface signals pass through. When a voltage domain on one side of an interface (e.g., one side of a domain crossing) is powering down, or is going to be powered down, an isolation signal may be provided to the domain crossing to activate the isolation cells and/or isolate the level shifters in the domain crossing. The isolation signal may be provided so that the output of the interface logic from the powering-down voltage domain is held at predetermined values. Holding the output at predetermined values for the powering down voltage domain may prevent the transmission of corrupted signal between the voltage domains, which may lead to functional failure in the SoC. For example, holding the output at predetermined values for the powering-down voltage domain may prevent the output values from floating to unknown once the voltage domain begins powering down.

Currently, an isolation signal is typically generated on a PMU (power management unit) located outside the main part of SoC (e.g., chip core) with the voltage domains. The voltage domains receive such an isolation signal through an I/O pad on the SoC (e.g., an I/O pad on the chip core). Receiving the isolation signal through the I/O pad, however, has an area cost on the SoC associated with the I/O pad as well as power and leakage costs associated with using the I/O pad. Additionally, there may be delays in receiving the isolation signal from the external PMU. Some current SoC implementations include mechanisms for generating the isolation signal on the SoC but these current mechanisms only generate the isolation signal when the whole voltage domain is at low power or almost fully turned off, which still allows transmission of some amount of corrupted signals.

SUMMARY

Various power detection circuits for generating an isolation signal within an SoC are described. One embodiment of a power detection circuit uses time-to-digital converter circuits placed in two different voltage domains to compare voltages in the voltage domains during operation of the SoC. The time-to-digital converter circuits include series of buffers with each buffer coupled to a flop. Outputs of the flops may be used to assess thermometer codes of each of the time-to-digital converter circuits. Comparison of the thermometer codes may then be used to determine whether one voltage domain (e.g., a switchable voltage domain) is powering down relative to another voltage domain (e.g., an always on voltage domain or a voltage domain that switches on/off via independent controls). The power detection circuit may output an isolation enable signal to the always on voltage domain in response to determining that the switchable voltage domain is powering down.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
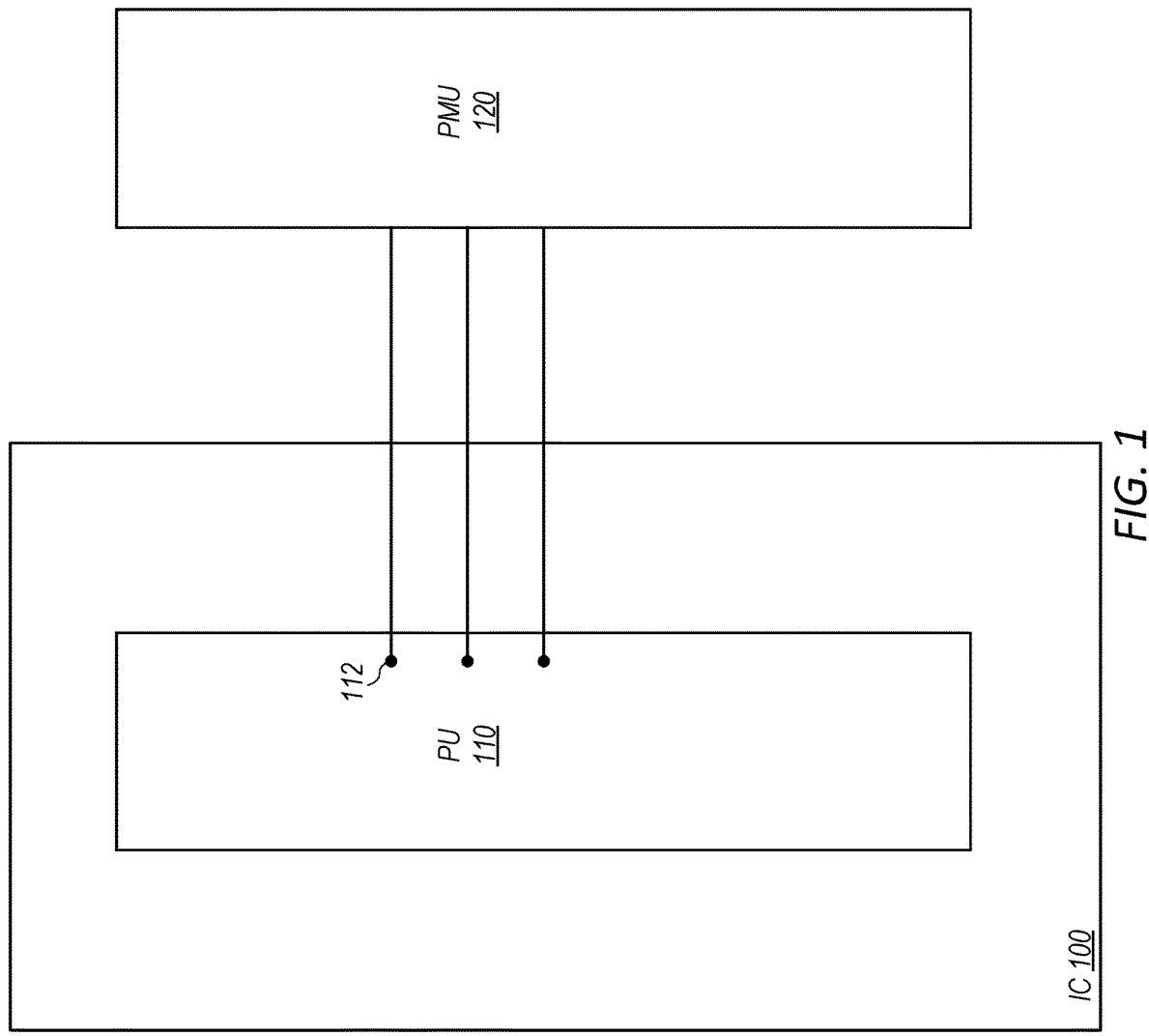
FIG. 1 depicts a block diagram of an embodiment of an integrated circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 depicts a block diagram of an embodiment of an integrated circuit (IC). In certain embodiments, IC 100 is an SoC (system on a chip). For example, IC 100 may include one or more processing units along with memory and input/output (I/O) ports associated with the processing units. In the embodiment shown, IC 100 includes a functional circuit block, processing unit (PU) 110. In various embodiments, other functional circuit blocks may be included in IC 100, including additional instances of PU 110. PU 110 is thus shown here as an exemplary functional circuit block, but is not intended to limit the scope of this disclosure. PU 110 may be a general purpose processor core, a central processing unit (CPU), a graphics processing unit (GPU), a digital signal processing unit, various peripheral circuitry such as audio or video processing hardware, storage peripherals, external peripheral interface controllers, communication peripherals, networking peripherals, or virtually any other kind of functional unit/circuitry configured to perform a processing function. The scope of this disclosure may apply to any of these types of functional circuit blocks, as well as others not explicitly mentioned herein. The number of functional circuit blocks shown here is by way of example as well, as the disclosure is not limited to any particular number.

In some embodiments, PU 110 is a general purpose processor core configured to execute the instructions of an instruction set and perform general purpose processing operations. Functional circuitry in PU 110 may thus include various types of circuitry such as execution units of various types (integer, floating point, etc.), register files, schedulers, instruction fetch units, various levels of cache memory, and other circuitry that may be implemented in a processor core. In some embodiments, PU 110 implements various types of graphics processing circuitry such that PU 110 is a GPU. Functional circuitry in PU 110 may thus include graphics processing cores, various types of memory and registers, and so on.

In the embodiment shown, PU 110, and all circuitry therein, is coupled to a power management unit (PMU) 120 through I/O pads 112 on PU 110. PMU 120 may provide supply voltages to circuitry in PU 110. PMU 120 may include various circuitry for power management. In certain embodiments, PMU 120 includes power management circuitry that adjusts the voltages for various reasons, such as controlling performance levels, thermal output, and/or power consumption. In various embodiments, other power management units may be coupled to IC 100, including additional instances of PMU 120. PMU 120 is thus shown here as an exemplary power management unit, but is not intended to limit the scope of this disclosure. For example, embodiments may be contemplated where PMU 120 is located on IC 100 and separate from PU 110.

In certain embodiments, PU 110 includes multiple voltage (power) domains where different voltage domains have different supply voltages. In such embodiments, PMU 120 may be capable of providing multiple supply voltages for use in the multiple voltage domains. For example, different supply voltages may be provided to each of I/O pads 112 from PMU 120.

Figure 2:
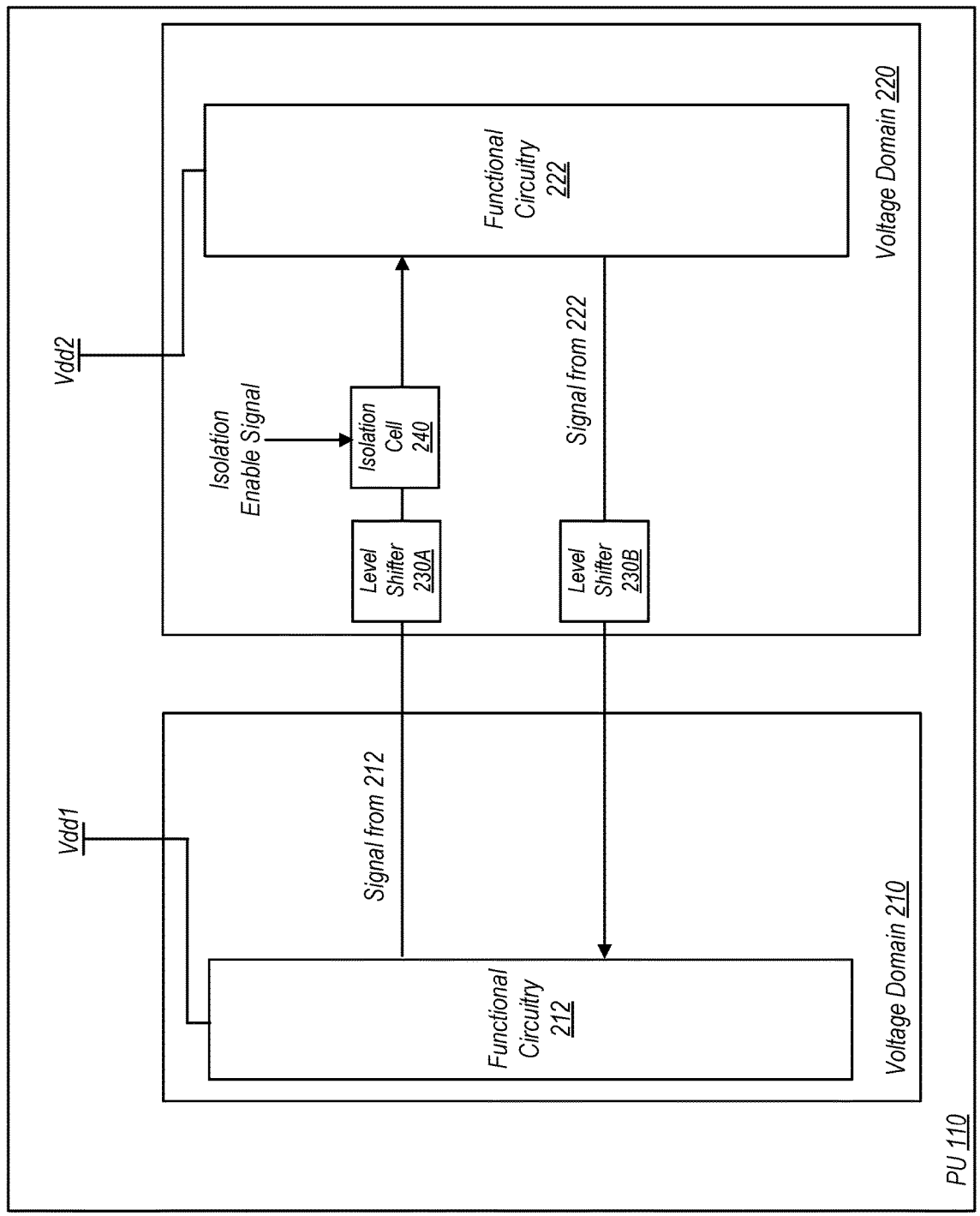
FIG. 2 depicts a block diagram of an embodiment of a processing unit with multiple voltage domains.

FIG. 2 depicts a block diagram of an embodiment of PU 110 with multiple voltage domains. In the embodiment shown, PU 110 includes voltage domain 210 and voltage domain 220. In various embodiments, other voltage domains may be included. Voltage domain 210 and voltage domain 220 are thus shown here as exemplary voltage domains, but are not intended to limit the scope of this disclosure. Voltage domain 210 and voltage domain 220 may define domains where functional circuitry (e.g., functional circuitry 212 and functional circuitry 222), or other logic, within each domain operate at the same supply voltage and have the same power gating properties (e.g., the circuitry can be in the same switchable voltage domain or in the same always on voltage domain, described below).

Voltage domain 210 and voltage domain 220 may be provided separate supply voltages from PMU 120. For example, in the embodiment shown, voltage domain 210 receives Vdd1 and voltage domain 220 receives Vdd2. Vdd1 and Vdd2 may be separate supply voltages provided to voltage domain 210 and voltage domain 220, respectively, through different I/O pads 112 (shown in FIG. 1) coupled to PMU 120. In some embodiments, Vdd1 and Vdd2 are different voltages. Different voltages may be provided to different voltage domains based on the functional circuitry (e.g., functional circuitry 212 and functional circuitry 222) located in each voltage domain. For example, voltage domains with analog circuitry may receive higher supply voltages than voltage domains with digital circuitry.

In some embodiments, a voltage domain is a switchable voltage domain. As used herein, a "switchable voltage domain" refers to a voltage domain where the power (e.g., the supply voltage) can be turned off or reduced to a small voltage to save power. Turning off or reducing the voltage in a switchable voltage domain may reduce power usage in IC 100 when functional circuitry in the switchable voltage domain is not needed to be turned on (e.g. the functional circuitry is idle temporarily, or is simply not in use in the device that includes the PU 110). In some embodiments, a voltage domain is an "always on" voltage domain. As used herein, an "always on voltage domain" refers to a voltage domain where the power (e.g., the supply voltage) remains at a substantially constant or fixed voltage whenever the IC 100 is receiving power. An always on voltage domain may include functional circuitry that has to remain fully powered for functional operation of IC 100 or a voltage domain that switches on/off via controls independent of the switchable voltage domain. In the embodiment shown, voltage domain 210 is a switchable voltage domain and voltage domain 220 is an always on voltage domain. Thus, Vdd1 is a switchable voltage that may be turned off to reduce power usage while Vdd2 is an always on supply voltage.

As shown in FIG. 2, signals may be provided (e.g., sent and received) between functional circuitry 212 in voltage domain 210 and functional circuitry 222 in voltage domain 220. In certain embodiments, signals crossing from one voltage domain to another voltage domain are level shifted by level shifters 230 to match the voltage of the receiving voltage domain. For example, a signal sent from functional circuitry 212 to functional circuitry 222 is level shifted by level shifter 230A from Vdd1 to Vdd2. Conversely, a signal sent from functional circuitry 222 to functional circuitry 212 is level shifted by level shifter 230B from Vdd2 to Vdd1.

In the embodiment shown, level shifters 230 are positioned in voltage domain 220 (e.g., the always on voltage domain). Level shifters 230 may, however, be positioned in either voltage domain 210 and/or voltage domain 220, as desired or needed according to the design of PU 110. For example, level shifters 230 may be placed in the receiving voltage domains with level shifter 230A positioned in voltage domain 220 and level shifter 230B positioned in voltage domain 210.

In certain embodiments, a signal crossing from a switchable voltage domain (e.g., voltage domain 210) to an always on voltage domain (e.g., voltage domain 220) needs to be isolated when the switchable voltage domain is powered down. Isolating the signal crossing from the switchable domain prevents the output values in the signal from floating to unknown values that may corrupt logic in the always on voltage domain. In certain embodiments, an isolation cell is placed on the signal crossing from the switchable voltage domain to the always on voltage domain. The isolation cell may be enabled when the switchable voltage domain is powering down or has powered down, as described herein.

In the embodiment shown, isolation cell 240 is placed on the signal crossing from voltage domain 210 to voltage domain 220. In certain embodiments, isolation cell 240 is placed in voltage domain 220. Other locations for isolation cell 240 may, however, be contemplated based on the design or implementation of PU 110. In some embodiments, the function of isolation cell 240 is combined with the function of level shifter 230A in a single cell. For example, an enable level shifter cell may be used to provide functions of both level shifting and isolation in a single cell.

In certain embodiments, isolation cell 240 is enabled when the isolation cell receives an isolation enable signal (e.g., from a power detection circuit, as described herein). When enabled, isolation cell 240 prevents crossing of the signal from voltage domain 210 to voltage domain 220 and provides a predetermined output to voltage domain 220. For example, isolation cell 240 may provide a clamped value of 0 or a 1 to voltage domain 220 when enabled or the isolation cell may provide a latched value (the value at the time the isolation enable signal is received) to voltage domain 220. In some embodiments, during normal operation (e.g., when isolation cell 240 is not enabled), the isolation cell may function as a buffer between voltage domain 210 and voltage domain 220. As shown in FIG. 2, an isolation enable signal may be received by isolation cell 240 to trigger isolation by the isolation cell.

Figure 3:
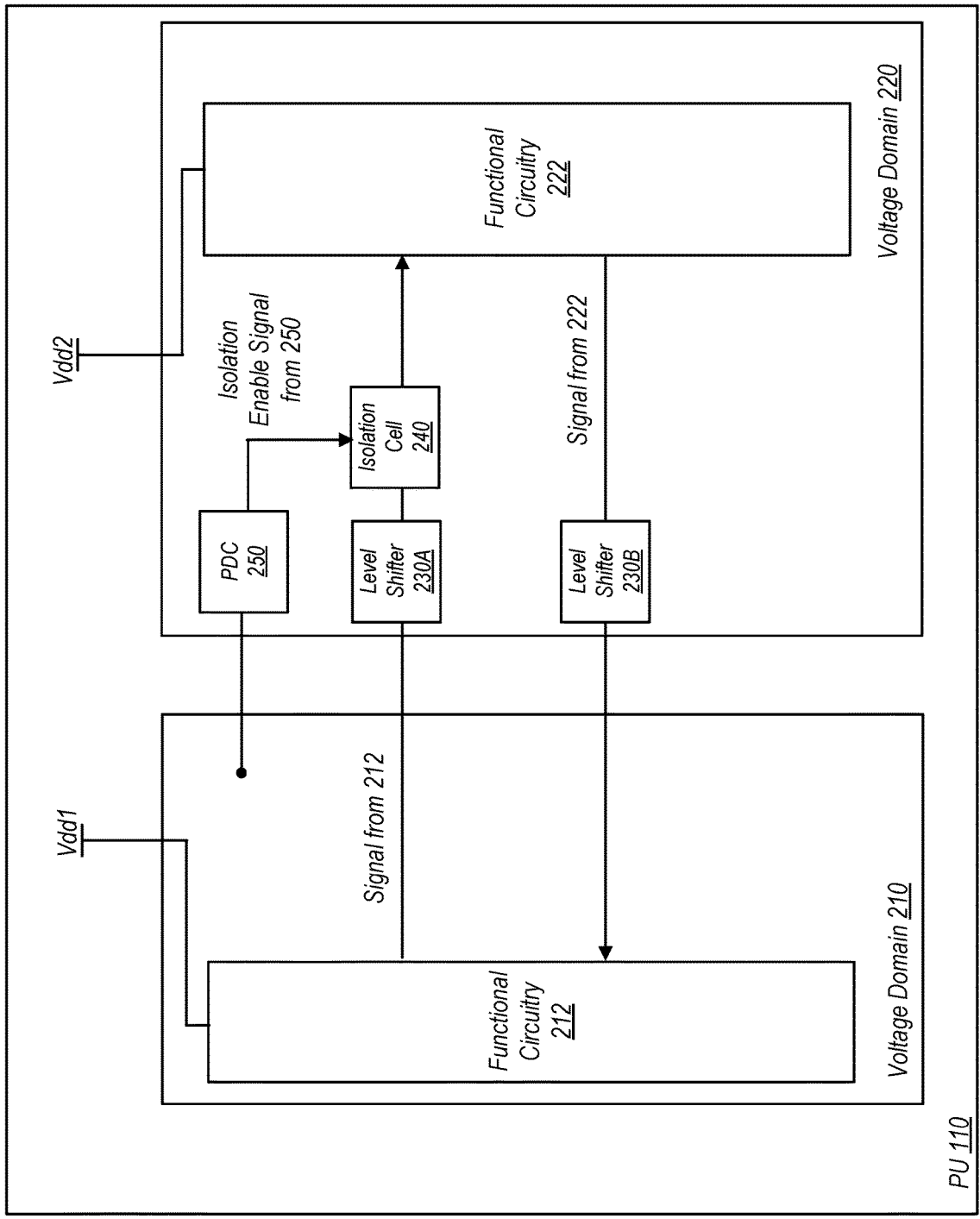
FIG. 3 depicts a block diagram of an embodiment of a processing unit with a power detection circuit in a voltage domain.

In certain embodiments, a power detection circuit (PDC) may provide the isolation enable signal to isolation cell 240. FIG. 3 depicts a block diagram of an embodiment of PU 110 with PDC 250 in voltage domain 220. In certain embodiments, PDC 250 provides (e.g., outputs) the isolation enable signal by detecting powering down of voltage domain 210. FIGS. 3-7 depict various embodiments of PDC 250 that may be implemented to detect powering down of voltage domain 210 and output an isolation enable signal to isolation cell 240. Each of the embodiments of PDC 250 depicted in FIGS. 3-7 provides powering down detection of voltage domain 210 on PU 110. The disclosed embodiments provide detection of powering down of voltage domain 210 at earlier times during the powering down than prior power detection techniques.

In certain embodiments, as shown in FIG. 3, PDC 250 is positioned in voltage domain 220 to place the PDC in an always on voltage domain. PDC 250 may, however, be positioned elsewhere in PU 110 based on the design or implementation of PU 110. In some embodiments, PDC 250 receives a voltage signal from voltage domain 210 (e.g., a signal corresponding to Vdd1) to determine when voltage domain 210 is powering down and provide an isolation enable signal to isolation cell 240.

Figure 4:
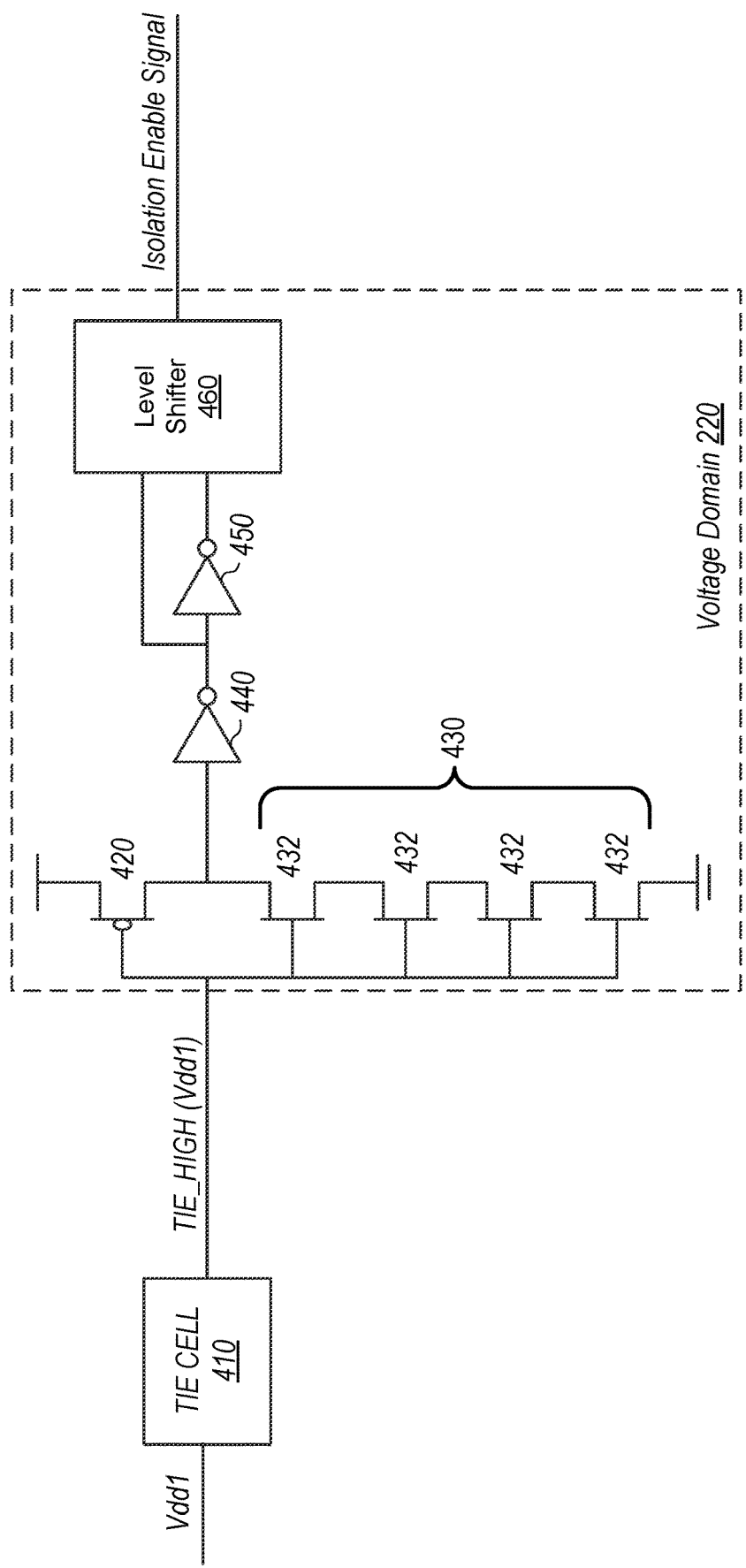
FIG. 4 depicts a block diagram of an example of a power detection circuit, according to some embodiments.

FIG. 4 depicts a block diagram of an example of PDC 250, according to some embodiments. In the embodiment shown, PDC 250 includes tie cell 410. In certain embodiments, tie cell 410 is coupled to the power supply of voltage domain 210 (e.g., Vdd1). Tie cell 410 may be used to avoid a direct connection between the power supply of voltage domain 210 and transistor 420 and transistor stack 430 in PDC 250. Tie cell 410 may be a tie-high cell that provides a constant high logic output that corresponds to the input voltage (Vdd1)(e.g., "Tie_High(VDD1)"). Thus, the output of tie cell 410 follows Vdd1.

The output of tie cell 410 is received at transistor 420 and transistor stack 430. In certain embodiments, transistor 420 is a pull-up transistor and transistor stack 430 is a pull-down transistor stack. For example, transistor 420 may be a PMOS (p-channel metal oxide semiconductor) transistor while transistor stack 430 includes transistors 432, which are NMOS (n-channel metal oxide semiconductor) transistors, connected in series. In the embodiment shown, transistor stack 430 includes four transistors 432 connected in series. The number of transistors 432 in transistor stack 430 may vary, however, based on a pull-up to pull-down ratio desired in PDC 250.

As shown in FIG. 4, transistor 420 and transistor stack 430 (along with inverter 440, inverter 450, and level shifter 460) are located in voltage domain 220. Thus, transistor 420 and transistor stack 430 may be coupled between source and ground of Vdd2 (e.g., the always on voltage supply for voltage domain 220). Inverter 440 is coupled between transistor 420 and transistor stack 430 to receive an output of either the pull-up value (e.g., logic high or "1") or the pull-down value (e.g., logic low or "0") based on the input to transistor 420 and transistor stack 430.

In the embodiment shown, when Vdd1 is at full power, transistor stack 430 is stronger in pulling down than transistor 420 is in pulling up and thus inverter 440 receives the pull-down value. As Vdd1 drops to or below a threshold value, however, transistor 420 draws enough current to overcome the resistance in transistor stack 430 and turns the value received in inverter 440 to the pull-up value. The threshold value of Vdd1 that causes the transition from the pull-down value to the pull-up value is determined based on the pull-up to pull-down ratio. The pull-up to pull-down ratio may be determined by the properties of transistor 420 and transistor stack 430, which includes the number of transistors 432 in transistor stack 430.

As shown in FIG. 4, the output of inverter 440 is coupled to inverter 450, which is then coupled to level shifter 460. Thus, when the pull-down value is being received by inverter 440, the output of inverter 440 is a logic high value (e.g., logic "1"), which is inverted by inverter 450 to a logic low value (e.g., logic "0") such that there is no output from PDC 250 (e.g., no isolation enable signal is output, or the isolation enable signal is de-asserted). When Vdd1 drops below the threshold value, however, inverter 440 receives the pull-up value and the output of inverter 440 is a logic low value, which is inverted by inverter 450 to a logic high value. The logic high value is then shifted to the voltage level of isolation cell 240 by level shifter 460 and output as the isolation enable signal (e.g. the isolation enable signal is asserted).

The embodiment of PDC 250 shown in FIG. 4, provides an isolation enable signal in response to a small change in Vdd1 that indicates voltage domain 210 is powering down. Thus, PDC 250 provides the isolation enable signal at early times of powering down of voltage domain 210 to provide early signal isolation by isolation cell 240, thereby reducing the occurrence of corrupted logic being transmitted to voltage domain 220. As described above, PDC 250 is, however, powered by voltage domain 220, which is always on. Thus, if there is a significant voltage difference between voltage domain 210 and voltage domain 220, there may be leakage caused by the constant on state of PDC 250. With smaller voltage differences between voltage domain 210 and voltage domain 220, the leakage may be smaller and more tolerable in IC 100.

Figure 5:
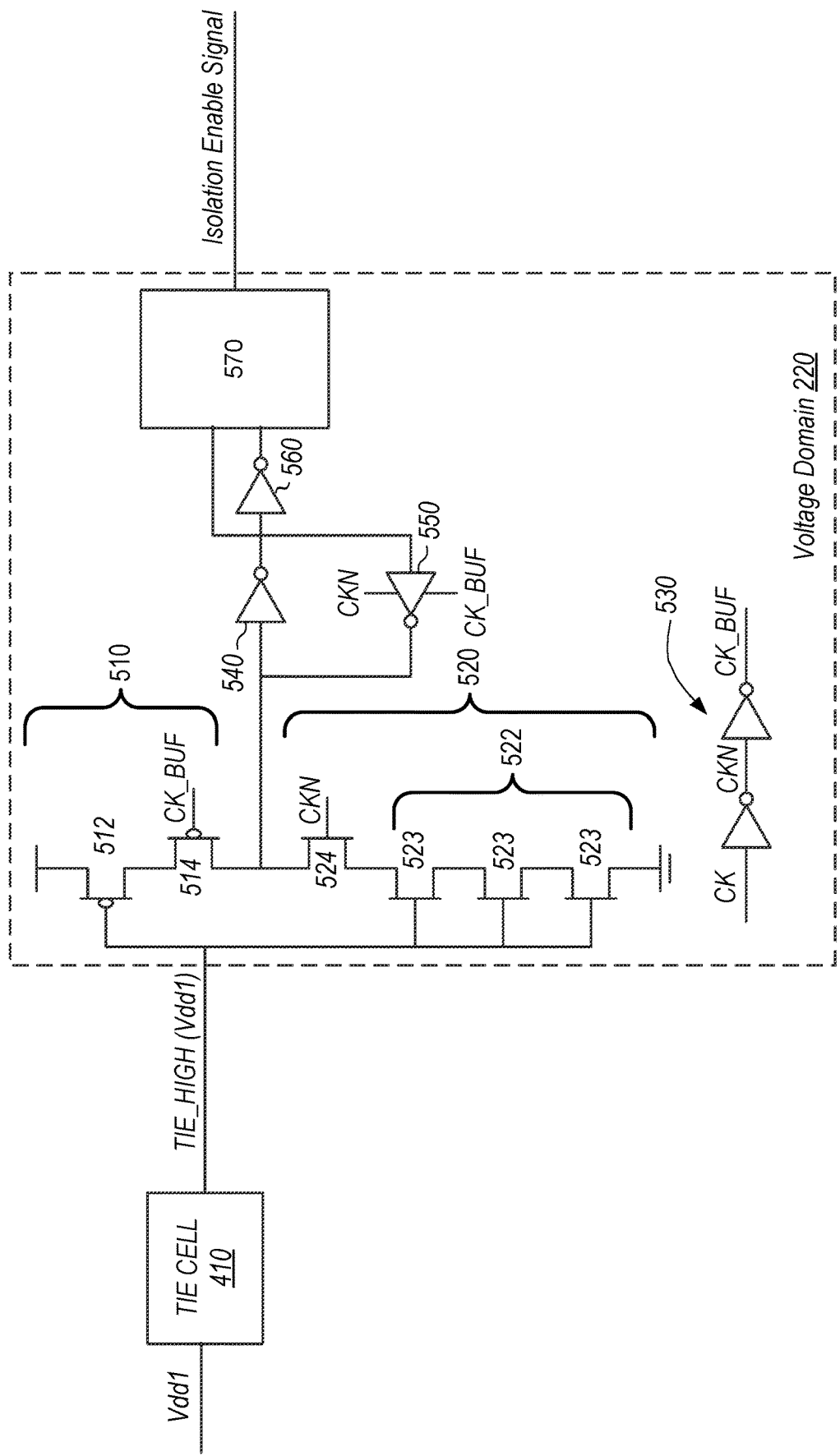
FIG. 5 depicts a block diagram of an example of a power detection circuit, according to some embodiments.

FIG. 5 depicts a block diagram of an example of PDC 250', according to some embodiments. The embodiment of PDC 250' shown in FIG. 5 functions similarly to the embodiment of PDC 250 shown in FIG. 4 where PDC 250' includes the addition of operating (e.g., clocking) the power detection at a lower frequency to reduce leakage in the power detection circuit. As shown in FIG. 5, the output of tie cell 410 ("Tie_High(Vdd1)") is received by pull-up network 510 and pull-down network 520. Pull-up network 510 includes transistor 512 gated by clocked transistor 514. Pull-down network 520 includes transistor stack 522, which includes transistors 523, gated by clocked transistor 524.

As shown in FIG. 5, clocked transistor 514 and clocked transistor 524 are clocked with inverted clock signals ("CKN" and "CK_BUF") from low frequency clock 530. Clock 530 may operate at a lower frequency than IC 100 and PU 110. For example, clock 530 may operate in the range of 100 MHz. As powering down of voltage domain 210 is typically a slow operation relative to operating speed of IC 100 and PU 110, PDC 250' may provide adequate detection of powering down of voltage domain 210 while operating at the frequency of clock 530.

Clocked transistor 514 and clocked transistor 524 are coupled to transistor 512 and transistor stack 522, respectively, such that the latch (formed from inverters 540 and 550) is engaged (or closed) for half the cycle of clock 530. Engaging the latch disables transistor 512 and transistor stack 522 in PDC 250'. Thus, power consumption by transistor 512 and transistor stack 522 is turned off and power detection is disabled for half the cycle of clock 530. Turning off power consumption for half the cycle may reduce leakage from PDC 250' by half as compared to PDC 250, shown in FIG. 4.

Additionally, inverter 540 and clocked inverter 550 may form a latch, as mentioned above. Clocked inverter 550 may be, for example, a tri-state inverter that is connected to the clock signals (e.g., "CKN" and "CK_BUF"). During the half clock cycle of the clock CK that the clocked inverter is active (e.g. not tri-stated), the latch is holding the value (e.g. logic "0" or "1") generated by the pull-up network 510 and the pull-down network 520 in the preceding half clock cycle.

When the latch is disengaged (open) in PDC 250', pull-up network 510 and pull-down network 520 function to provide logic output in response to Vdd1 input from tie cell 410. For example, when Vdd1 is at full power, pull-down network 520 (using transistor stack 522) is stronger in pulling down than pull-up network 510 (using transistor 512) is in pulling up and thus inverter 540 receives the pull-down value. As Vdd1 drops to or below a threshold value, however, transistor 512 in pull-up network 510 draws enough current to overcome the resistance in transistor stack 522 in pull-down network 520 and turns the value received in inverter 540 to the pull-up value. As with the embodiment depicted in FIG. 4, the threshold value of Vdd1 that causes the transition from the pull-down value to the pull-up value is determined based on the pull-up to pull-down ratio, which is determined by the properties of transistor 512 and transistor stack 522.

As shown in FIG. 5, the output of inverter 540 is coupled to inverter 560, which is then coupled to level shifter 570. Thus, in the embodiment shown, the isolation enable signal is output by PDC 250' when Vdd1 drops below the threshold value and the logic high value is received in inverter 540. In some embodiments, clock 530 may only be enabled during periods where there is a high probability that voltage domain 210 may power down (such as when certain operations in IC 100 are stopped). Only enabling clock 530 during these periods may further reduce leakage in PDC 250' by further reducing periods of powering on of the PDC.

For the embodiments of PDC 250 and PDC 250', shown in FIGS. 4 and 5, respectively, the threshold voltage for providing the isolation enable signal may be process, voltage, and temperature (PVT) dependent. Thus, the threshold voltage may vary due to variations, either globally or locally, in IC 100. Additionally, the threshold voltage in PDC 250 and PDC 250' is determined based on the design of the PDC before implementation and the threshold voltage cannot be modified after implementation (other than variations caused by PVT dependence).

Figure 6:
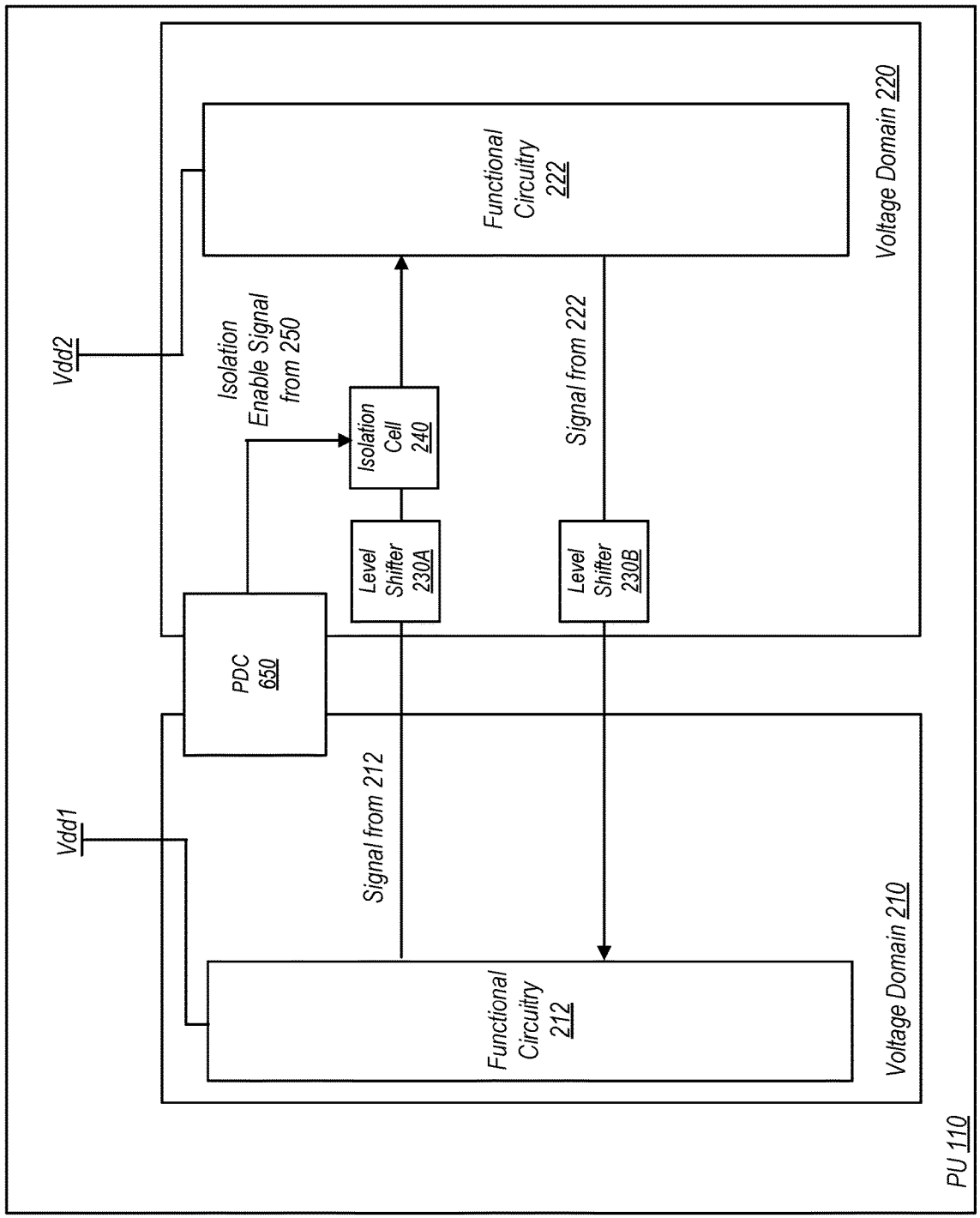
FIG. 6 depicts a block diagram of an embodiment of a processing unit with a power detection circuit positioned between voltage domains.

FIG. 6 depicts a block diagram of an embodiment of PU 110 with PDC 650 positioned between voltage domain 210 and voltage domain 220. In certain embodiments, PDC 650 is positioned with portions of the PDC in both voltage domain 210 and voltage domain 220 to provide connections to both voltage domains. In some embodiments, however, PDC 650 may be positioned outside both voltage domain 210 and voltage domain 220 with connections provided to the voltage domains. In yet other embodiments, PDC 650 may be positioned in either voltage domain 210 or voltage domain 220 with connections provided to the other voltage domain.

Figure 7:
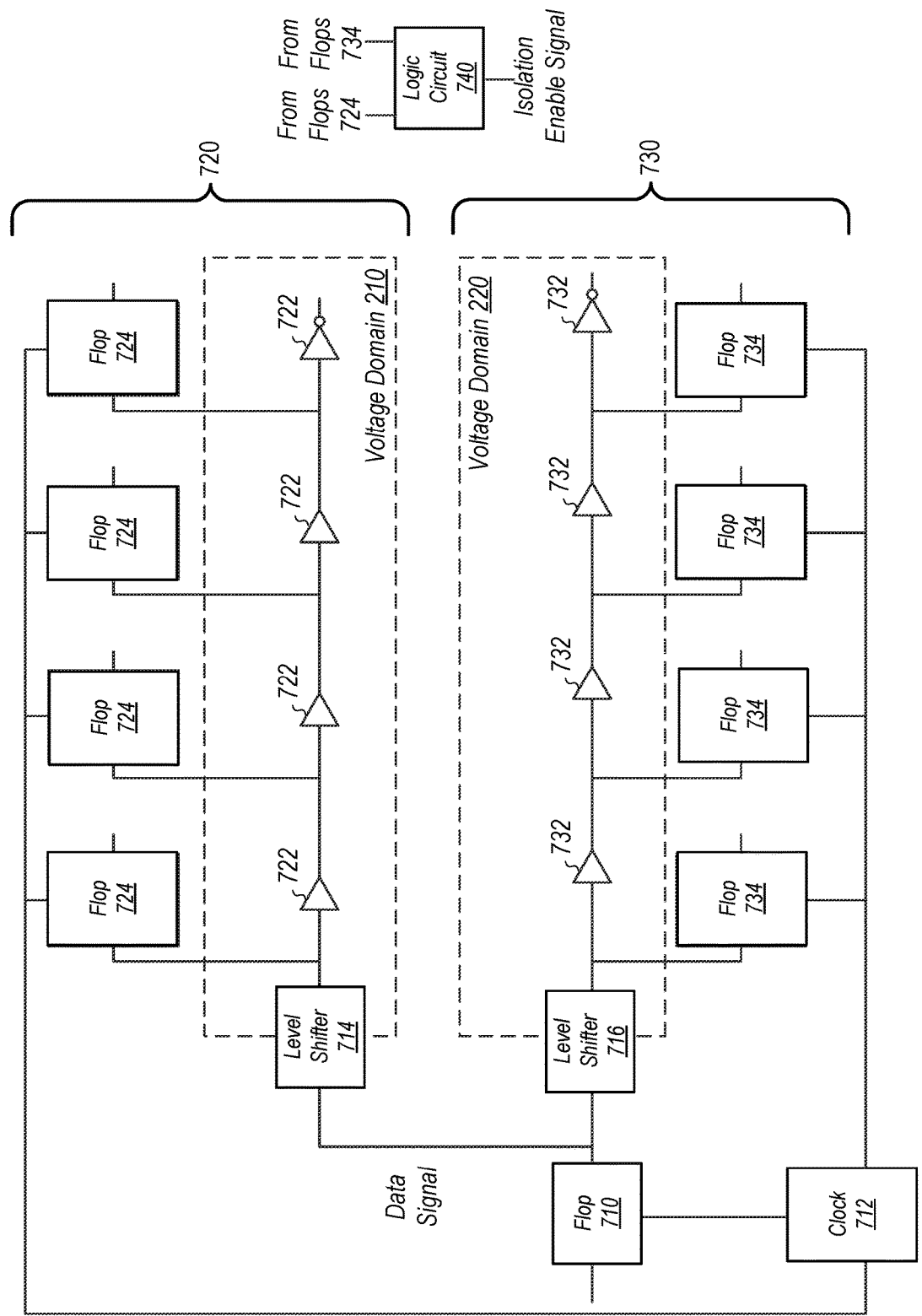
FIG. 7 depicts a block diagram of an example of a power detection circuit, according to some embodiments.

FIG. 7 depicts a block diagram of an example of PDC 650, according to some embodiments. In the embodiment shown, PDC 650 includes flop 710 providing an input data signal to first time-to-digital converter circuit 720 (hereinafter "first circuit 720") and second time-to-digital converter circuit 730 (hereinafter "second circuit 730"). First circuit 720 is located in, or coupled to, voltage domain 210 (e.g., the switchable voltage domain) and Vdd1. Second circuit 730 is located in, or coupled to, voltage domain 220 (e.g., the always on voltage domain) and Vdd2.

Flop 710 may be coupled to clock 712. Clock 712 may control timing of signals for flop 710 and flops in first circuit 720 and second circuit 730 (described below). In some embodiments, clock 712 operates at a lower frequency than PU 110 and IC 100. As shown in FIG. 7, flop 710 provides a data signal, based on the timing of clock 712, as input to first circuit 720 and second circuit 730. In certain embodiments, flop 710 is coupled to first circuit 720 using level shifter 714. Level shifter 714 may shift the voltage of the data signal to the voltage for voltage domain 210 (e.g., Vdd1 voltage). Flop 710 may be coupled to second circuit 730 using level shifter 716. Level shifter 716 may shift the voltage of the data signal to the voltage for voltage domain 220 (e.g., Vdd2 voltage).

In certain embodiments, first circuit 720 includes a series of buffers 722 with each buffer coupled to a flop 724 and the next buffer in the series. Each buffer may itself be two inverters in series, for example, so that the input of the buffer is reflected on its output after the delay of evaluating the series of inverters. Other embodiments may form a buffer 722 from other (even) numbers of inverters, or may implement other buffering circuits. Similarly, second circuit 730 includes a series of buffers 732 with each buffer coupled to a flop 734 and the next buffer in the series. In the embodiment shown, first circuit 720 has 3 buffers 722 and 4 flops 724 while second circuit 730 also has 3 buffers 732 and 4 flops 734. The number of buffers (and corresponding flops) in each circuit may, however, vary as needed depending on the requirements of PDC 650. In certain embodiments, first circuit 720 and second circuit 730 have the same number of buffers and flops. Some embodiments may be contemplated, however, where the number of buffers 722 and flops 724 in first circuit 720 is different from the number of buffers 732 and flops 734 in second circuit 730.

In some embodiments, buffers 722 and buffers 732 may be inverters (e.g., first circuit 720 and second circuit 730 both include series of inverters). In such embodiments, the inversions provided by the series of inverters may be compensated for by using inverting flops for odd number flops 724 in first circuit 720 and inverting flops for odd number flops 734 in second circuit 730. Non-inverting flops may be used for even number flops 724 in first circuit 720 and even number flops 734 in second circuit 730. Using inverting flops for odd number flops and non-inverting flops for even flops, in combination with inverters, in first circuit 720 and second circuit 730, may provide similar functionality to using non-inverting flops with buffers in the first circuit and the second circuit.

In certain embodiments, buffers 722 in first circuit 720 are located in voltage domain 210 while flops 724 are located outside the voltage domain. Similarly, buffers 732 in second circuit 730 may be located in voltage domain 220 while flops 734 are located outside the voltage domain. For example, in some embodiments, flops 724 and flops 734 are located in another voltage domain (such as a Vdd3 voltage domain) that is outside voltage domain 210. In such embodiments, flops 724 and flops 734 may be capable of receiving data from voltage domain 210 and shifting the data to the voltage domain for the flops (e.g., Vdd3). Flops 724 and flops 734 may thus be, for example, level-shifting flops. In some embodiments, flops 724 and flops 734 are located in separate voltage domains outside voltage domain 210. For example, flops 724 are located in a Vdd3 voltage domain and flops 734 are located in a Vdd4 voltage domain. Flops 724 and flops 734 may receive data from voltage domain 210 and shift the data to the particular voltage domain for each set of flops.

The voltage domain location of flops 724 and flops 734 may, however, vary based on the design of PDC 650. For example, in some embodiments, flops 724 and/or flops 734 are located in voltage domain 210. As shown in FIG. 7, flops 724 and flops 734 are coupled to clock 712 to provide time-controlled operation of the flops. Thus, in embodiments with flops 724 and/or flops 734 located in voltage domain 210, the clock signal from clock 712 is level shifted before going to flops 724 and/or flops 734. In other embodiments with flops 724 and/or flops 734 located in a voltage domain outside voltage domain 210, the clock signal from clock 712 may or may not be level shifted depending on the location of the clock (e.g., if the clock is in the same voltage domain as the flops or not).

In the embodiment shown, PDC 650 operates to detect power changes in voltage domain 210 and Vdd1 by comparing the outputs of flops 724 in first circuit 720 to the outputs of flops 734 in second circuit 730 in response to the data signal from flop 710. For first circuit 720, as flops 724 are coupled to buffers 722, which are coupled in series, the data signal from flop 710 will trigger a certain number of flops 724 (e.g., change the output of the flops from "0" to "1") over a predetermined time period. The number of flops 724 with changed output depends on the voltage applied to buffers 722 (e.g., Vdd1 from voltage domain 210). The higher the voltage, the greater the number of flops 724 with changed outputs over the predetermined time period because the buffers 722 may evaluate more rapidly than if the voltage is lower. The number of flops 724 with changed outputs over the predetermined time period may be referred to as a thermometer code for first circuit 720.

Second circuit 730 may operate similarly with the data signal from flop 710 triggering a certain number of flops 734 over the predetermined time period as determined by voltage Vdd2 in voltage domain 720. The number of flops 734 with changed outputs over the predetermined time period may be referred to as a thermometer code for second circuit 730. Thus, a comparison of the number of flops 724 with changed output (e.g., the thermometer code of first circuit 720) versus the number of flops 734 with changed output (e.g., the thermometer code of second circuit 730) over the predetermined time period may provide information about the relationship between the voltage in voltage domain 210 (Vdd1) and the voltage in voltage domain 220 (Vdd2). For example, the number of flops 724 with changed output in first circuit 720 may be less than the number of flops 734 with changed output in second circuit 730 when Vdd1 is less than Vdd2.

In certain embodiments, PDC 650 assesses changes in the thermometer code of first circuit 720 (the number of flops 724 with changed output over a predetermined time period) versus the thermometer code of second circuit 730 (the number of flops 734 with changed output over the predetermined time period) to assess changes in the voltage in voltage domain 210 versus the voltage in voltage domain 220. The outputs of flops 724 and flops 734 may be coupled to logic circuit 740. Logic circuit 740 may include logic capable of comparing the thermometer code of first circuit 720 (from the outputs of flops 724) to the thermometer code of second circuit 730 (from the outputs of flops 734). For example, logic circuit 740 may include logic that assesses the number of flops 724 with an output of "1" before a transition to an output of "0" is reached in flops 724 versus the number of flops 734 with an output of "1" before a transition to an output of "0" is reached in flops 734 to assess the thermometer codes of first circuit 720 and second circuit 730, respectively.

During operation of IC 100 and PU 110, changes in the thermometer code of first circuit 720 versus the thermometer code of second circuit 730 may indicate changes in the voltage of voltage domain 210 versus the voltage in voltage domain 220 that corresponds to powering down of voltage domain 210. For example, at full power operation in IC 100, the thermometer code of first circuit 720 may be 1111 (all four flops have changed outputs over a predetermined time period) while the thermometer code of second circuit 730 is also 1111. As voltage domain 210 begins powering down, however, the thermometer code of first circuit 720 may change to 1110 (the first three flops have changed outputs over the predetermined time period but the fourth flop does not) while the thermometer code of second circuit 730 remains 1111. The change in the thermometer code of first circuit 720 (represented by the transition from 1 to 0 in the thermometer code) indicates that the voltage is dropping in voltage domain 210 versus the voltage in voltage domain 220, which may be indicative that voltage domain 210 is beginning to power down.

In certain embodiments, PDC 650 outputs an isolation enable signal (e.g., the isolation enable signal is asserted from logic circuit 740) when the thermometer code of first circuit 720 drops below a threshold value in comparison to the thermometer code of second circuit 730. In some embodiments, the threshold value is a trigger difference (e.g., difference in number of flops with outputs changed over predetermined time period) between first circuit 720 and second circuit 730. For example, for the embodiment shown with 4 flops in each of first circuit 720 and second circuit 730, the threshold value may be a difference of one flop triggered between first circuit 720 and second circuit 730 (e.g., 3 flops triggered in first circuit 720 (thermometer code 1110) versus 4 flops triggered in second circuit 730 (thermometer code 1111)). Other embodiments may use other trigger distances (e.g. 2, or more than 2, as desired). The larger the trigger distance, the more slowly the PDC 650 may react to the dropping voltage in the switchable voltage domain. However, a larger trigger distance may also prevent isolation if noise in the system causes the thermometer codes to differ by a small amount periodically.

As PDC 650 determines whether to provide the isolation enable signal based on a direct comparison of the voltage in voltage domain 210 versus the voltage in voltage domain 220, PDC 650 makes the determination substantially independent of variations in PVT since both voltages and circuits vary according to the same factors in IC 100 and PU 110. For example, if PVT varies in IC 100 such that both the voltage in voltage domain 210 and the voltage in voltage domain 220 drop, the thermometer codes of first circuit 720 and second circuit 730 will also both change accordingly. Thus, if the thermometer code of first circuit 720 changes to 1110 but the thermometer code of second circuit 730 also changes to 1110, there is still no difference in the number of flops with changed outputs (e.g., triggers) between first circuit 720 and second circuit 730. With both thermometer codes changing, there is no difference between the thermometer codes detected and the difference between the thermometer codes remains above the threshold value such that no isolation enable signal is output by PDC 650 (e.g., the isolation enable signal is de-asserted by logic circuit 740). Similarly, if temperature variations or process variations cause changes in the speed of operation of the circuitry, the speed of operation may track each other in the two thermometer codes and no change may be seen in the output of the comparison of the thermometer codes.

In some embodiments, the threshold value for the difference between the thermometer code of first circuit 720 and the thermometer code of second circuit 730 is predetermined. For example, the threshold value may be determined based on the properties of IC 100 and/or PU 110. In certain embodiments, the threshold value for the difference between the thermometer code of first circuit 720 and the thermometer code of second circuit 730 is determined based on relationships between the thermometer codes and between the voltages in voltage domain 210 and voltage domain 220 assessed during operation of IC 100 and/or PU 110. Determining the threshold value during operation of IC 100 and/or PU 110 may allow the threshold value to be determined uniquely for each IC 100 and/or PU 110 based on operating properties (e.g., operating speed) of the IC and/or PU.

In such embodiments, PDC 650 may assess (e.g., using logic circuit 740) the thermometer code of first circuit 720 and the thermometer code of second circuit 730 during power up of IC 100 and PU 110 to calibrate the relationship between the thermometer codes and between the voltages in voltage domain 210 and voltage domain 220. For example, the thermometer code of first circuit 720 and the thermometer code of second circuit 730 may be assessed at multiple voltage conditions during power up of IC 100 and PU 110. The assessment of the thermometer codes at the multiple voltage conditions may then be used to determine an acceptable threshold value (e.g. trigger difference) between the thermometer codes. In some embodiments, the acceptable threshold value is a threshold value that provides an indication that voltage domain 210 is powering down and that the change in voltage is not due to expected variations in the voltage during normal operation. Setting the threshold value at an acceptable threshold value may also include setting the threshold value that triggers PDC 650 to provide the isolation enable signal at early onset of powering down of voltage domain 210 to prevent corrupted logic being provided to voltage domain 220.

As described above, in certain embodiments, PDC 650 operates at the speed of clock 712, which operates at a lower frequency than IC 100 and PU 110. Clock 712 may operate at the lower frequency to reduce power consumption by PDC 650 as PDC 650 does not need to operate at the frequency of PU 110 and IC 100 to be effective in generating the isolation enable signal. In some embodiments, clock 712 may only be enabled during periods where there is a high probability that voltage domain 210 may power down (such as when certain operations in IC 100 are stopped).

Example Method

Figure 8:
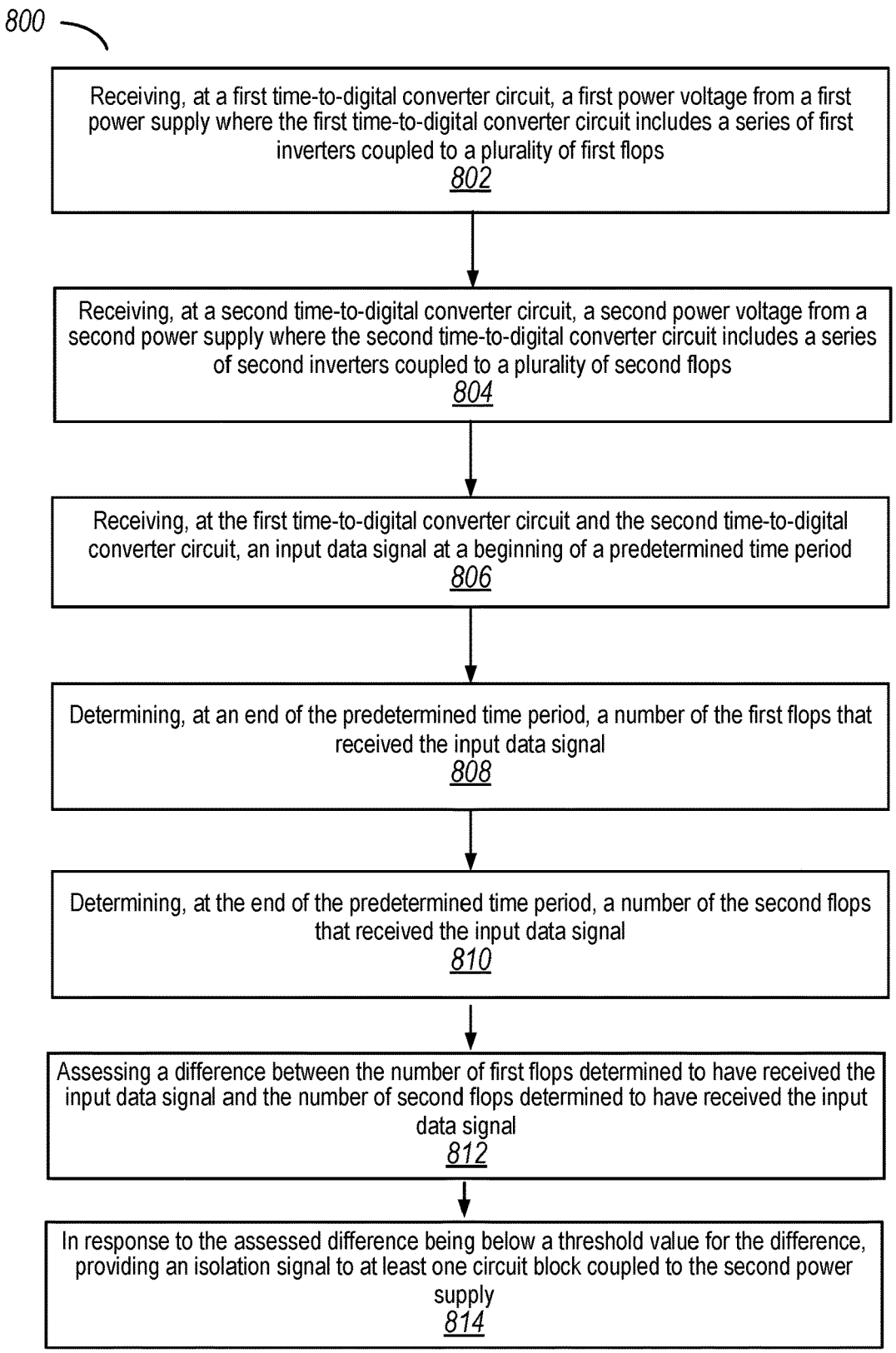
FIG. 8 is a flow diagram illustrating a method for determining to provide an isolation enable signal, according to some embodiments.

FIG. 8 is a flow diagram illustrating a method for determining to provide an isolation enable signal, according to some embodiments. Method 800 may be implemented using any of the embodiments of a sensor circuit as disclosed herein, in conjunction with any circuitry or other mechanism to solve for voltage and temperature based on respective ring oscillator frequencies.

At 802, in the illustrated embodiment, a first time-to-digital converter circuit receives a first power voltage from a first power supply where the first time-to-digital converter circuit includes a series of first buffers coupled to a plurality of first flops.

At 804, in the illustrated embodiment, a second time-to-digital converter circuit receives a second power voltage from a second power supply where the second time-to-digital converter circuit includes a series of second buffers coupled to a plurality of second flops.

At 806, in the illustrated embodiment, the first time-to-digital converter circuit and the second time-to-digital converter circuit receive an input data signal at a beginning of a predetermined time period. In some embodiments, a voltage level of the input data signal is shifted to voltage levels for the first time-to-digital converter circuit and the first time-to-digital converter circuit. In some embodiments, the input data signal is provided in response to an event in the at least one circuit block that indicates the first power voltage is going down. In some embodiments, the input data signal is provided to the first time-to-digital converter circuit and the first time-to-digital converter circuit at a lower frequency than an operating frequency of the at least one circuit block.

At 808, in the illustrated embodiment, at an end of the predetermined time period, a number of the first flops that received the input data signal is determined. In some embodiments, determining the number of first flops that received the input data signal over the predetermined time period is determined by a location of a first transition in the first flops from 1 to 0, or vice versa, at the end of the predetermined time period.

At 810, in the illustrated embodiment, at the end of the predetermined time period, a number of second flops that received the input data signal is determined. In some embodiments, determining the number of second flops that receive the input data signal over the predetermined time period is by a location of a second transition in the second flops from 1 to 0, or vice versa, at the end of the predetermined time period.

At 812, in the illustrated embodiment, a difference between the number of first flops determined to have received the input data signal and the number of second flops determined to have received the input data signal is assessed.

At 814, in the illustrated embodiment, an isolation signal to at least one circuit block coupled to the first power supply is provided in response to the assessed difference being below a threshold value for the difference. In some embodiments, the threshold value for the difference is determined by calibrating the threshold value during power up of the first power supply and the second power supply based on a number of the first flops that receive the input data signal and a number of the second flops that receive the input data signal at various voltages encountered during power up.

Example Computer System

Figure 9:
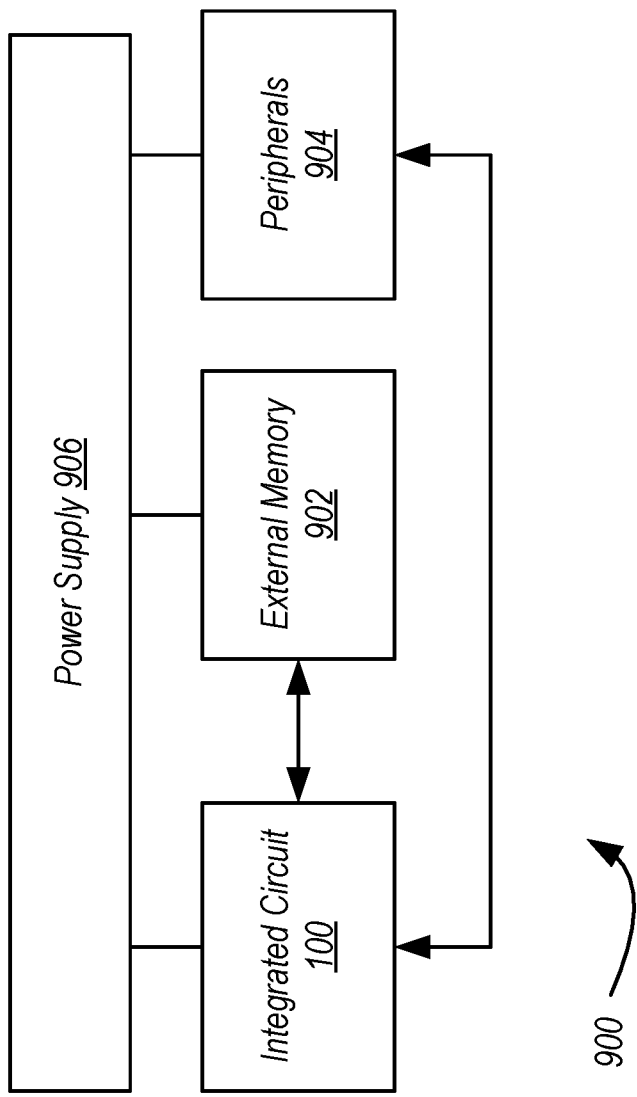
FIG. 9 is a block diagram of one embodiment of an example system.

Turning next to FIG. 9, a block diagram of one embodiment of a system 900 is shown. In the illustrated embodiment, the system 900 includes at least one instance of an integrated circuit 100 coupled to external memory 902. The integrated circuit 100 may include a memory controller that is coupled to the external memory 902. The integrated circuit 100 is coupled to one or more peripherals 904 and the external memory 902. A power supply 906 is also provided which supplies the supply voltages to the integrated circuit 100 as well as one or more supply voltages to the memory 902 and/or the peripherals 904. In some embodiments, more than one instance of the integrated circuit 100 may be included (and more than one external memory 902 may be included as well).

The peripherals 904 may include any desired circuitry, depending on the type of system 900. For example, in one embodiment, the system 900 may be a mobile device (e.g. personal digital assistant (PDA), smart phone, etc.) and the peripherals 904 may include devices for various types of wireless communication, such as WiFi, Bluetooth, cellular, global positioning system, etc. The peripherals 904 may also include additional storage, including RAM storage, solid-state storage, or disk storage. The peripherals 904 may include user interface devices such as a display screen, including touch display screens or multitouch display screens, keyboard or other input devices, microphones, speakers, etc. In other embodiments, the system 900 may be any type of computing system (e.g. desktop personal computer, laptop, workstation, tablet, etc.).

The external memory 902 may include any type of memory. For example, the external memory 902 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 902 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature.

Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A device, comprising:
   a power detection circuit coupled to a power supply in a first voltage domain, wherein the power detection circuit includes;
     a first transistor configured to receive a voltage signal from the power supply;
     a plurality of second transistors stacked in series, wherein the second transistors are configured to receive the voltage signal from the power supply in parallel to the first transistor;
     a first inverter coupled between the first transistor and the plurality of second transistors;
     a clock; and
     a second inverter coupled to the clock and the first inverter, wherein the first inverter and the second inverter form a latch, the latch being configured to hold an output of the first inverter when the latch is engaged and to release the output of the first inverter when the latch is disengaged;
   wherein the power detection circuit is configured to generate an isolation signal to a second voltage domain when the voltage signal from the power supply in the first voltage domain drops below a threshold voltage.

2. The device of claim 1, further comprising a tie cell coupled to the power supply in the first voltage domain, wherein the tie cell provides the voltage signal that corresponds to a voltage of the power supply to the first transistor and the plurality of second transistors.

3. The device of claim 1, further comprising a third transistor and a fourth transistor coupled to the clock, wherein the third transistor is latched to the first transistor and the fourth transistor is latched to the plurality of second transistors, and wherein the clock operates at a lower frequency than at least one circuit block in the first voltage domain.

4. The device of claim 1, wherein a number of second transistors in the plurality of second transistors stacked in series determines the threshold voltage for the isolation signal.

5. The device of claim 1, wherein the second voltage domain is a substantially constant voltage domain.

6. The device of claim 5, wherein the power detection circuit is positioned in the second voltage domain.

7. The device of claim 1, wherein the power detection circuit includes a third inverter coupled to an output of the first inverter.

8. The device of claim 1, wherein the power detection circuit includes a level shifter configured to output the isolation signal at a voltage level corresponding to the second voltage domain.

9. A method comprising:
   receiving, at a power detection circuit, a voltage signal from a power supply in a first voltage domain, wherein the power detection circuit includes a first transistor and a plurality of second transistors stacked in series;
   providing the voltage signal in parallel to the first transistor and the plurality of second transistors, wherein a third transistor is latched to the first transistor and a fourth transistor is latched to the plurality of second transistors, and wherein the third transistor and the fourth transistor operate at a lower frequency than at least one circuit block in the first voltage domain; and
   generating, by an inverter coupled between the first transistor and the plurality of second transistors, an isolation signal for a second voltage domain when the voltage signal from the power supply in the first voltage domain drops below a threshold voltage, the threshold voltage being determined by a number of second transistors in the plurality of second transistors stacked in series.

10. The method of claim 9, further comprising receiving the voltage signal from a tie cell coupled to the power supply in the first voltage domain.

11. The method of claim 9, further comprising, before providing the isolation signal to the second voltage domain:
   inverting, by a second inverter coupled to the inverter, the isolation signal; and
   level shifting the isolation signal to a voltage level corresponding to the second voltage domain.

12. A device, comprising:
   a power detection circuit coupled to a power supply in a first voltage domain, wherein the power detection circuit includes;
     a first transistor configured to receive a voltage signal from the power supply;
     a plurality of second transistors stacked in series, wherein the second transistors are configured to receive the voltage signal from the power supply in parallel to the first transistor;
     a clock;
     a third transistor coupled to the clock, the third transistor being latched to the first transistor;
     a fourth transistor coupled to the clock, the fourth transistor being latched to the plurality of second transistors; and
     a first inverter coupled between the first transistor and the plurality of second transistors;
   wherein the power detection circuit is configured to generate an isolation signal to a second voltage domain when the voltage signal from the power supply in the first voltage domain drops below a threshold voltage.

13. The device of claim 12, further comprising a tie cell coupled to the power supply in the first voltage domain, wherein the tie cell provides the voltage signal that corresponds to a voltage of the power supply to the first transistor and the plurality of second transistors.

14. The device of claim 12, wherein the clock operates at a different frequency that at least one circuit block in the first voltage domain.

15. The device of claim 12, wherein the clock operates at a lower frequency than circuit blocks in the device.

16. The device of claim 12, wherein the third transistor is latched to the first transistor and the fourth transistor is latched to the plurality of second transistors by the first inverter and a second inverter coupled to the clock.

17. The device of claim 12, wherein the third transistor being latched to the first transistor and the fourth transistor being latched to the plurality of second transistors is configured to turn off power to the first transistor and the plurality of second transistors for half a cycle of the clock.

18. The device of claim 12, wherein the clock is configured to be enabled during periods of time when the first voltage domain is expected to turn off.

19. The device of claim 12, wherein the threshold voltage for the isolation signal is determined by a number of second transistors in the plurality of second transistors.

20. The device of claim 1, wherein the clock operates at a lower frequency than at least one circuit block in the first voltage domain.

* * * * *